US012785711B1

(12) United States Patent
Dedic et al.

(10) Patent No.: US 12,785,711 B1
(45) Date of Patent: Nov. 3, 2026

(54) PUSH-PULL SAMPLER/MULTIPLEXER SYSTEM AND METHOD

(71) Applicant: Cisco Technology, Inc., San Jose, CA (US)

(72) Inventors: Ian Dedic, Maynard, MA (US); Gavin Allen, Maynard, MA (US); Ramesh K. Singh, Maynard, MA (US); John Danson, Maynard, MA (US)

(73) Assignee: Cisco Technology, Inc., San Jose, CA (US)

( * ) Notice: Subject to any disclaimer, the term of this patent is extended or adjusted under 35 U.S.C. 154(b) by 79 days.

(21) Appl. No.: 18/825,685

(22) Filed: Sep. 5, 2024

Related U.S. Application Data

(60) Provisional application No. 63/536,559, filed on Sep. 5, 2023.

(51) Int. Cl.
*H03M 1/00* (2006.01)
*H03M 1/12* (2006.01)

(52) U.S. Cl.
CPC .................................. *H03M 1/126* (2013.01)

(58) Field of Classification Search
CPC .................................................... H03M 1/126
See application file for complete search history.

(56) References Cited

U.S. PATENT DOCUMENTS 7,519,135 B2 * 4/2009 Staszewski ............ H03D 7/125 375/346
11,082,054 B1 * 8/2021 Cascio ................ H03M 1/0697
2003/0035499 A1 * 2/2003 Staszewski ............ H03D 7/125 375/350
2005/0069070 A1 * 3/2005 Paillet .................. H04L 7/0079 375/355
2010/0253414 A1 * 10/2010 Dedic .................. H03M 1/121 327/415

* cited by examiner

*Primary Examiner* — Jean B Jeanglaude
(74) *Attorney, Agent, or Firm* — Patterson + Sheridan, LLP

(57) ABSTRACT

A method that may include receiving a first data signal at a first sampler input including charge pulses of a first amplitude; receiving a second data signal at a second sampler input including charge pulses of a second amplitude; transmitting the first data signal to a first transistor network including a first push-pull pair of transistors of the first transistor network; controlling the push-pull pair using a pair of clock signals, each clock signal of the pair has a complementary phase and thereby operating the first push-pull pair at a frequency lower than an overall sampling rate of one or more ADCs; and outputting a plurality of push-pull charge pulses from the sample, wherein when the push-pull charge pulses are combined at a demultiplexer, the combined pulses have a third amplitude greater than the first amplitude or the second amplitude.

20 Claims, 2 Drawing Sheets

PUSH-PULL SAMPLER/MULTIPLEXER SYSTEM AND METHOD

CROSS REFERENCE TO RELATED APPLICATIONS

This application claims priority to and benefit of U.S. Provisional Patent Application Ser. No. 63/536,559 filed on Sep. 5, 2023, the entirety of which is incorporated by reference herein.

FIELD

This disclosure relates generally to the field of analog-to-digital conversion in microelectronics.

BACKGROUND

Contemporary optical communications and other integrated electronic circuits make extensive use of analog-to-digital converter devices that are advantageously mass-produced in various configurations for various purposes.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

DESCRIPTION OF EXAMPLE EMBODIMENTS

Overview

Figure 1:
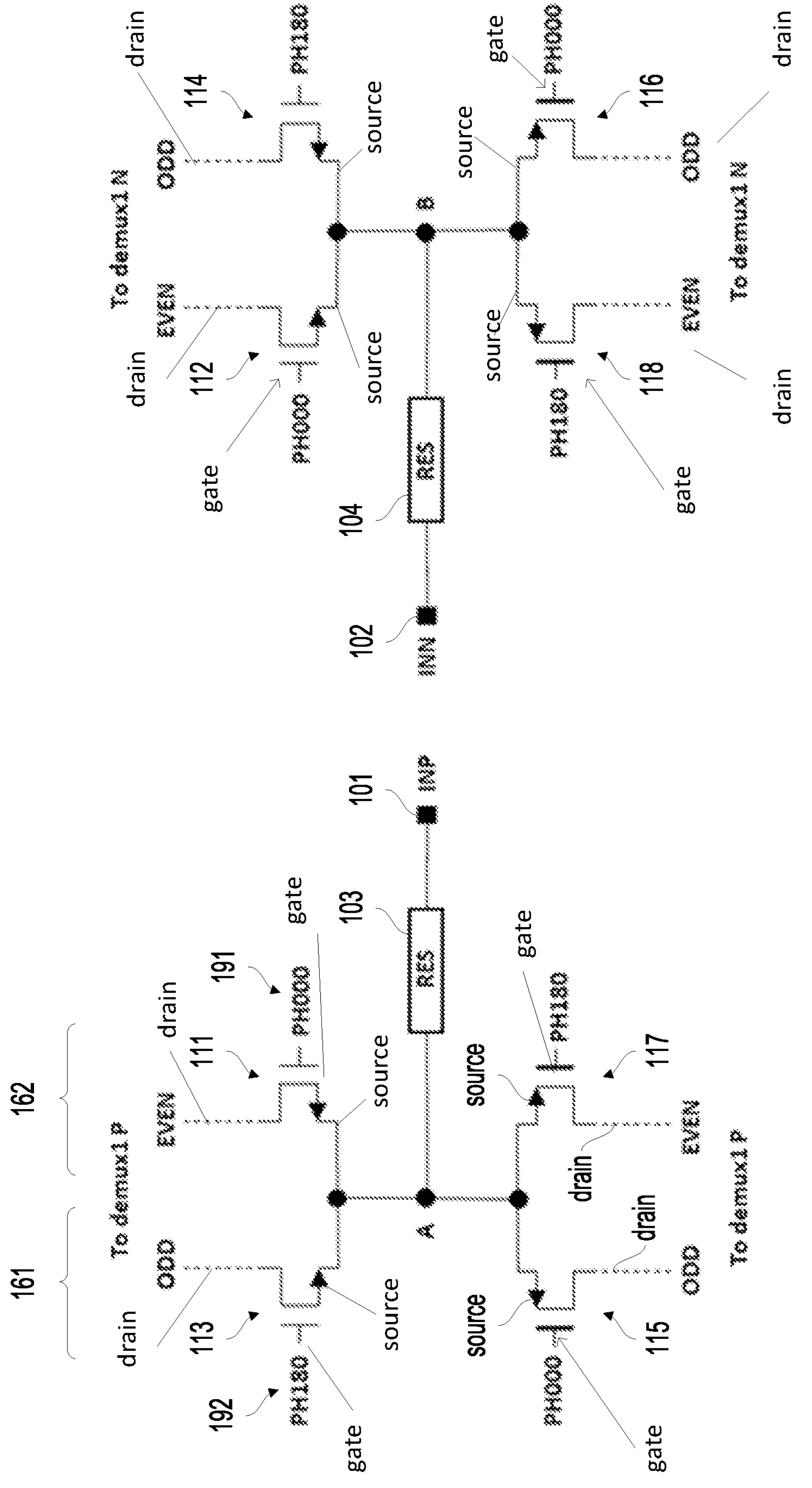
FIG. 1 is a circuit diagram of a push-pull sampler according to an exemplary embodiment of the disclosure.

In part, in one aspect, the disclosure relates to method of sampling a current signal for use by one or more analog to digital converters (ADCs). The method may include receiving a first data signal at a first input of a sampler including charge pulses of a first amplitude and receiving a second data signal at a second input of the sampler including charge pulses of a second amplitude. The method may also include transmitting the first data signal to a first transistor network including a first push-pull pair of transistors of the first transistor network; controlling the first push-pull pair using a pair of clock signals, wherein each clock signal of the pair has a complementary phase and thereby operating the first push-pull pair to operate at a frequency lower than an overall sampling rate of one or more ADCs; and outputting a plurality of push-pull charge pulses from the sampler, wherein when the plurality of push-pull charge pulses are combined at a demultiplexer, the combined pulses have a third amplitude greater than the first amplitude or the second amplitude.

In part, in another aspect, the disclosure relates to a system that includes a sampler that includes a first input configured to receive a first signal and a second input configured to receive a second signal; and a first upper switching element that includes a first pair of switching devices, wherein each switching device of the first pair of switching devices has a source, a gate, and a drain, wherein the source of each switching device of the first pair of switching devices is connected to a first common node, wherein the drain of one switching device of the first pair of switching devices generates a first odd output and the drain of another switching device of the first pair of switching devices generates a first even output, wherein the gate of the one switching device of the first pair of switching devices receives a first clock signal and the gate of the other switching device of the first pair of switching devices receives a second clock signal; the system further includes a first lower switching element that includes a second pair of switching devices, wherein each switching device of the second pair of switching devices has a source, a gate, and a drain, wherein the source of each switching device of the second pair of switching devices is connected to the first common node, wherein the drain of one switching device of the second pair of switching devices generates a second odd output and the drain of another switching device of the second pair of switching devices generates a second even output, wherein the gate of the one switching device of the second pair of switching devices receives the second clock signal and the gate of the other switching device of the second pair of switching devices receives the first clock signal, wherein the first input is connected to the first common node.

Example Embodiments

Some embodiments of the disclosure relate to a time-interleaved sampling circuitry configured to be driven by substantially sinusoidal clock signals. The sampling circuitry or sampler may be incorporated in ADC circuitry, for example as integrated circuitry on an integrated circuit or as part of a photonic integrated circuit. In addition, the disclosure also relates to a low-power high-performance front-end sampling/demultiplexing system for a high-speed (100+ gigasamples) analog to digital converter (ADC) and related methods. In some embodiments, the front-end system is configured to demultiplex a sampled signal to drive an array of lower-speed interleaved ADCs. In some embodiments, analog-to-digital converters (ADCs) operating at high sampling rates, e.g. greater than about 100 gigasamples per second, may use a time-interleaved approach wherein multiple sub-ADCs operate in parallel. In a time-interleaved ADC, each sub-ADC operates at a sampling rate lower than the overall sampling rate of the ADC.

There can be various challenges with systems that use a time-interleaved ADC as part of such a front-end system design. One problem is that as the sampling rate increases, the sampling window and amount of sampled signal becomes smaller because it is inversely proportional to the sampling rate. This results in less signal to work with relative to any noise in the system. It is therefore desirable to maximize the input signal at the point it is sampled. This approach supports having a large signal to support a larger current in various signal lines in the system.

A second problem that the system design may face is that at the output of the demultiplexer where the charge pulses are converted back to voltage there is a large common-mode current, which causes large voltage swings that reduce circuit headroom and may cause clipping, saturation or other unwanted effects.

A third problem that the system design may face is that as the sample rate increases, the array of sub-ADCs needed to convert the input samples increases. As a result, the input samples are distributed over a larger circuit area. In turn, this increases the parasitic capacitance which reduces circuit performance at high frequencies.

In some embodiments, the sampler may use switches arranged in a push-pull configuration where the input signal either flows into the "push" switches or the "pull" switches. The common-mode currents for the push and pull sections are equal in magnitude but opposite in sign. The differences in sign may result in cancelling the common mode currents when they are summed or combined. In various embodiments, when charge pulses are combined this results in combined charge pulses. In turn, when the push and pull charge pulses are combined at the demultiplexer output all or substantially all of the signal current sums to larger pulses to address the first problem above. In addition, as noted herein, the common-mode currents cancels, which addresses the second problem relating to decreased headroom and the associated unwanted effects. The output of the push-pull sampler may also be connected to a first and a second lower rate ADCs by transmission lines to tune out the parasitic and achieve higher ADC bandwidth.

In many embodiments of the disclosure, a sampler may generate current pulses or analog samples of an analog signal. In many embodiments, the analog samples or current pulses are generated by a transistor network arranged in a push-pull configuration, wherein push-pull pairs are regulated by clock signals of staggered, complementary phases, allowing each push-pull pair to operate at a frequency lower than the overall sampling rate of the ADC. In some embodiments, a first clock signal and a second clock signal are used to control or regulate one or more transistors in the transistor network. In many embodiments, analog samples or current pulses are routed to demultiplexers via transmission lines in a way that reduces mutual/parasitic capacitance.

Refer now to the exemplary embodiment of FIG. 1. FIG. 1 is a circuit diagram of a push-pull sampler. The sampler operates in a current mode and receives a differential input signal that includes INP 101 and INN 102. In many embodiments, as a voltage at the INP node increases, a current flows into p-channel (+) metal-oxide-semiconductor field effect transistors (PMOS) switches 115, 117. Similarly, in many embodiments, as a voltage at the INP node decreases, a current flow is pulled out of n-channel (−) metal-oxide-semiconductor field effect transistors (NMOS) switches 111, 113. Both PMOS and NMOS devices/switches on the INP side are operable to transmit current to downstream components that participate in an analog-to-digital conversion. As a result, in some embodiments, all or approximately all the input current at the INP node is used in an analog-to-digital conversion rather than being partially wasted in a passive input network. NMOS devices and PMOS devices may include various suitable p- and n-doped transistor-based devices or switches without limitation.

In various embodiments, analog samples or current pulses of the input current at INP are created due to the clocks PH000 191 and PH180 192 applied to the gates of the various respective PMOS and NMOS devices/switches that steer current between an ODD branch 161 and an EVEN branch 162. Clocks PH000 191 and PH180 192 are out of phase with respect to each other and so only one branch (EVEN or ODD) is active at any time. The various clocks 191, 192 are clock signals such as a first clock signal and a second clock in some embodiments. The first clock signal and the second clock signal may be supplied by clock generators or other clock signal sources as application for a given sampler application. In some embodiments, a first push-pull pair of the sampler may be controllable in response to a first clock signal and a second clock signal.

In various embodiments, all PMOS devices/switches 115, 117 and all NMOS devices/switches 111, 113 are in electrical communication with demultiplexers that further distribute current pulses to sub-ADCs. In various embodiments, an input resistor 103 may be chosen to present a matched input termination to a driving circuit, thereby maximizing or increasing power delivered to the sampler by the driving circuit, or equivalently minimizing current loss into the sampler. In various embodiments, multiple PMOS devices such as first and second PMOS devices or switches may be used. In various embodiments, multiple NMOS devices such as first and second NMOS devices or switches may be used.

In many embodiments, an input current flows from the INN node 102 that is equivalent to but opposite in phase from the current that flows into the INP node 101. Current is similarly pushed into PMOS devices/switches 116, 118 or pulled from NMOS devices/switches 112, 114 according to whether the input current at INN is increasing or decreasing. In many embodiments, current is sampled and steered between an EVEN branch and an ODD branch using clocks PH000 191 and PH180 192 applied to the gates of the various respective switches/devices. In some embodiments, the EVEN branch and the ODD branch may be referenced as a first branch and a second branch or vice versa. In some embodiments, clocks 191, 192 may be about 180 degrees out of phase. An input resistor 104 or other resistive element may similarly be chosen to present a matched input termination to a driving circuit, thereby maximizing or increasing power delivered to the sampler by the driving circuit, or equivalently minimizing current loss into the sampler. In some embodiments, resistors 103, 104 have a resistance that ranges from about 10 ohms to about 100 ohms. Finally, in many embodiments, PMOS devices/switches 116, 118 and all NMOS devices/switches 112, 114 are in electrical communication with demultiplexers that further distribute current pulses to sub-ADCs.

In various embodiments, the source terminal of an NMOS device acts as a source of current when pulling current from NMOS devices, and in various embodiments, the source terminal of a PMOS device acts as a sink for current when pushing current into the PMOS devices. In many embodiments, the drain terminal of any PMOS or NMOS device is in electrical communication with a transmission line, which is in turn in electrical communication with a demultiplexer. In various embodiments, the gate terminal of a PMOS or NMOS device is modulated by one of the clock signals PH000 191 or PH180 192, and determines when the devices is active and sampling. In various embodiments, the different switching devices such as the NMOS and PMOS devices of FIG. 1 may each of drains, sources, and gates. The various elements of these devices may be identified using the terms, first, second, third, etc., without limitation.

Figure 2:
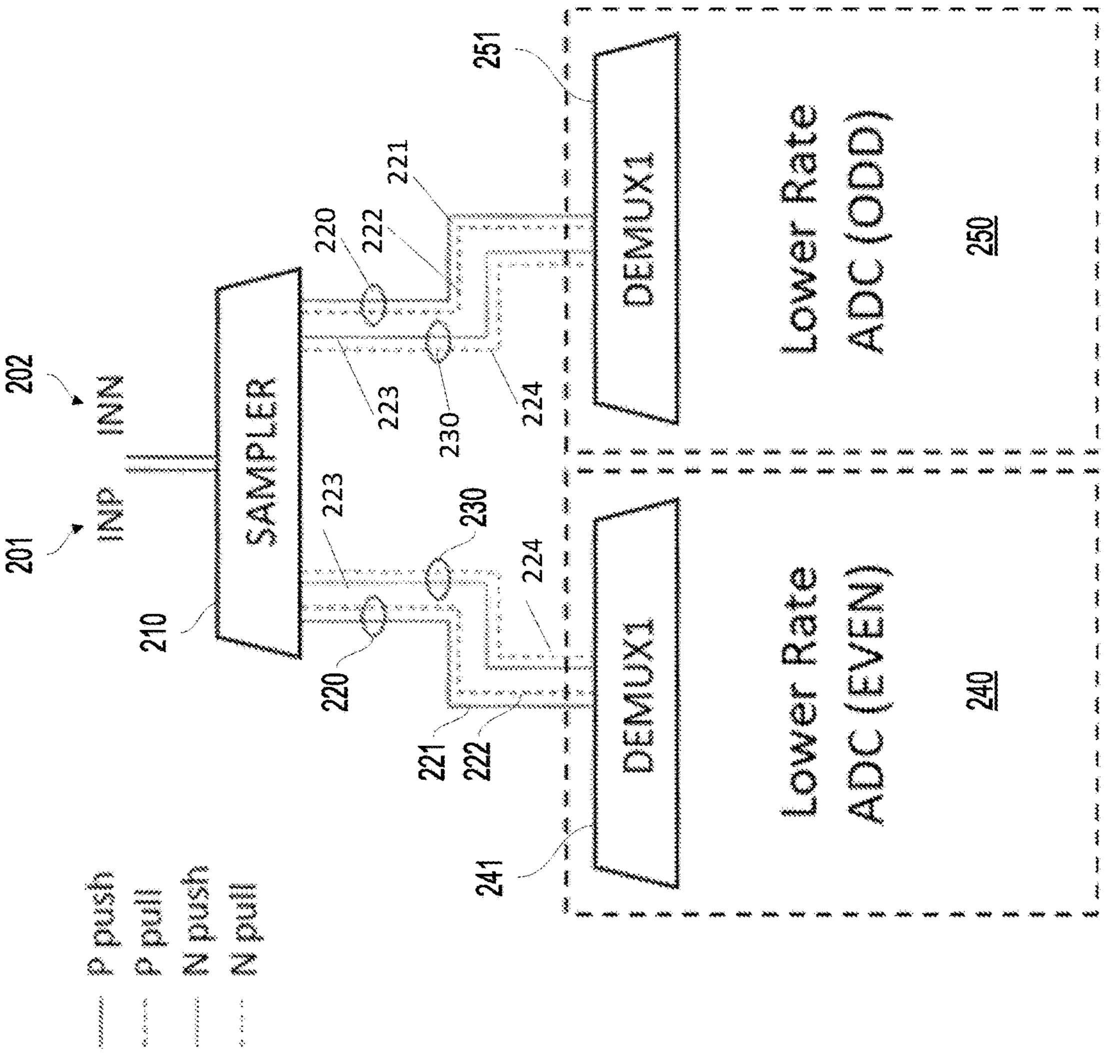
FIG. 2 is a diagram of a time-interleaved push-pull analog-to-digital converter (ADC) according to an exemplary embodiment of the disclosure.

Refer now to the exemplary embodiment of FIG. 2. FIG. 2 is a diagram of a time-interleaved push-pull analog-to-digital converter (ADC), including a sampler 210, sub-ADC banks 240, 250, and demultiplexers (demuxes) 241, 251. In some embodiments, the first sub-ADC bank is EVEN and the second sub-ADC bank 250 is ODD or vice versa. In various embodiments, demultiplexers 241, 251 may be the same type of demultiplexer (demux). In various embodiments, a given pair of switching devices may generate even outputs such as a first even output and a second even output.

n some embodiments, demultiplexer 241 may be a first demultiplexer. The first demultiplexer may be configured to receive a positive push signal and a positive pull signal such as from sampler 210. In some embodiments, demultiplexer 251 may be a second demultiplexer. The second demultiplexer may be configured to receive a negative push signal and a negative pull signal such as from sampler 210. In some embodiments, each demux receives every other pulse, and the demux will further distribute pulses into more subADCs/demuxes. For example, for a 1:4 demux, a downstream device would get every eighth pulse. In various embodiments, for a given demux such as demux 241, 251 demultiplexing is performed such as about 1:N overall in both 241 and 251, wherein N is a positive integer greater than 1 (2, 3, etc.). This demultiplexing occurs in conjunction with N individual ADCs in each of bank 240 and bank 250. In various embodiments, each sub-ADC bank 240 or 250 may include additional demultiplexing stages before an individual current pulse is finally converted into a digital value by an individual ADC. A differential input pair, that includes currents INP 201 and INN 202, is sampled by the sampler 210, creating discrete current pulses that are transmitted via transmission lines to sub-ADC banks 240, 250. In many embodiments, the sub-ADC banks may include demultiplexers 241, 251 that pick individual current pulses to distribute to individual sub-ADCs in each bank 240, 250.

In various embodiments, a DC current I flows in all branches of the sampler 210. In many embodiments, when current pulses emerge from the time-interleaved outputs of the pull side of a demultiplexer-only one demultiplexer is active at once—they may have a DC current −I, while current pulses flowing from the 'push' side may have an equal but opposite DC content +I. In many embodiments, a current signal ±I/2 is superimposed on either the 'push' side or the 'pull' side. In many embodiments, the 'push' current and the 'pull' current are summed, which eliminates DC content (+I)+(−I)=0 leaving only the signal ±I/2. In many embodiments, where the current pulses are converted back to voltage, eliminating the common-mode DC current reduces the headroom requirement at a voltage-summing node. In various embodiments, the common-mode currents for the push and pull sections of the sampler are equal in magnitude but opposite in sign. Thus, one common-mode current may be negative while another common-mode current is positive. In various embodiments, some of the signals transmitted between the switches and other circuit elements of the push-pull sampler shown in FIG. 1 may include signals such as a first signal that is a positive current signal and a second signal is a negative current signal.

In many embodiments, a number of sub-ADCs may be large; in some embodiments the number of sub-ADCs may be at least about 100 or greater than about 100. Distributing various clock signals and current pulses to each sub-ADC therefore presents a design challenge. In many embodiments, transmission lines may be used to route current from the sampler 210 to demultiplexers 241, 251. In many embodiments, the transmission line impedance may be raised slightly to absorb the parasitic capacitance at the output of the sampler switches and the input of a demultiplexer 241, 251. This allows a sampler-demultiplexer bandwidth to be maintained and even peaked to improve the overall frequency response of the ADC. In some embodiments, it is desirable to connect a sampler to a first lower rate ADC and a second lower rate ADC using transmissions lines operable to tune out parasitic capacitance.

In many embodiments, a current from a 'push' switch is in phase with a current from an associated 'pull' switch. In some embodiments, the change, increase or raising of the value of the transmission line impedance may range from about 50 to about 70 ohms. Thus, in many embodiments, corresponding 'push' and 'pull' currents, e.g. a current 221 from a 'push' PMOS and a current 222 from a 'pull' NMOS on an ODD branch sampling the INP signal, are routed as a pair 220 of signal lines in close proximity. As shown in FIG. 2, the pair of signal lines 220 includes a P push current line and P pull current line. The P push current line 221 is in close proximity and follows the P pull current line 222. In contrast, the pair of signal lines 230 includes a N push current line and N pull current line. The N push current line 223 is in close proximity and follows the N pull current line 224. In some embodiments, the pairs of current lines 220 and 230 together form a differential signal line. In various embodiments, current 221 and current 222 may be referenced as a first current or a push current and a second current or a pull current or vice versa. Because these currents are in-phase, the effective unit length capacitance of the transmission line is reduced and the impedance of the transmission line is increased. In many embodiments, a spacing between a pair 220 sampling the input INP and a pair 230 sampling the input INN can be adjusted, along with a spacing between each pair and a ground shield, to obtain the desired impedance for optimal performance. In various embodiments, the current lines may be referred to as signal lines and vice versa.

In some embodiments, a number of sub-ADC banks and a number of demultiplexers may increase with a number of branches in a sampler. In some embodiments, the number of branches and sub-ADC banks may be two or more. In some embodiments, the number of branches and sub-ADC banks may be four.

In some embodiments, a demultiplexer may be a tree or a cascade of individual demultiplexers. For example, a 1:16 demultiplexer may include a first 1:4 demultiplexer with an additional 1:4 demultiplexer at each of the outputs of the first 1:4 demultiplexer.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, coatings/layers, optical paths, waveguides, splitters, couplers, combiners, electro-optical devices, switches, samplers, ADCs, signal lines, switching networks, inputs, outputs, ports, channels, components and parts of the foregoing disclosed herein can be used with any laser, laser-based communication system, waveguide, fiber, transmitter, transceiver, receiver, and other devices and systems without limitation. In various embodiments, signal data may be received from a transmitter.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

In various embodiments, a processor may be a physical or virtual processor. In other embodiments, a virtual processor may be spread across one or more portions of one or more physical processors. In certain embodiments, one or more of the embodiments described herein may be embodied in hardware such as a Digital Signal Processor (DSP). In certain embodiments, one or more of the embodiments herein may be executed on a DSP. One or more of the embodiments herein may be programmed into a DSP. In some embodiments, a DSP may have one or more processors and one or more memories. In certain embodiments, a DSP may have one or more computer readable storages. In many embodiments, a DSP may be a custom designed ASIC chip. In other embodiments, one or more of the embodiments stored on a computer readable medium may be loaded into a processor and executed. In general, references to first and second elements to identified items may be used or changed without limitation.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112, sixth paragraph. Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

What is claimed is:

1. A method of sampling a current signal for use by one or more analog to digital converters (ADCs) comprising:
- receiving a first data signal at a first input of a sampler comprising charge pulses of a first amplitude;
- receiving a second data signal at a second input of the sampler comprising charge pulses of a second amplitude;
- transmitting the first data signal to a first transistor network comprising a first push-pull pair of transistors of the first transistor network;
- controlling the first push-pull pair using a pair of clock signals, wherein each clock signal of the pair has a complementary phase, thereby operating the first push-pull pair at a frequency lower than an overall sampling rate of one or more ADCs; and
- outputting a plurality of push-pull charge pulses from the sampler, wherein when the plurality of push-pull charge pulses are combined at a demultiplexer, the combined push-pull charge pulses have a third amplitude greater than the first amplitude or the second amplitude.

2. The method of claim 1, further comprising cancelling common mode currents when the plurality of push-pull charge pulses are combined.

3. The method of claim 1, further comprising connecting the sampler to a first lower rate ADC and a second lower rate ADC using transmissions lines operable to tune out parasitic capacitance.

4. A system comprising:
- a sampler comprising:
  - a first input configured to receive a first signal and a second input configured to receive a second signal; and
  - a first upper switching element comprising:
    - a first pair of switching devices, wherein each switching device of the first pair of switching devices has a source, a gate, and a drain, wherein the source of each switching device of the first pair of switching devices is connected to a first common node,
- wherein the drain of one switching device of the first pair of switching devices generates a first odd output and the drain of another switching device of the first pair of switching devices generates a first even output, wherein the gate of the one switching device of the first pair of switching devices receives a first clock signal and the gate of the other switching device of the first pair of switching devices receives a second clock signal;

the system further comprising:

a first lower switching element comprising:

a second pair of switching devices, wherein each switching device of the second pair of switching devices has a source, a gate, and a drain, wherein the source of each switching device of the second pair of switching devices is connected to the first common node, wherein the drain of one switching device of the second pair of switching devices generates a second odd output and the drain of another switching device of the second pair of switching devices generates a second even output, wherein the gate of the one switching device of the second pair of switching devices receives the second clock signal and the gate of the other switching device of the second pair of switching devices receives the first clock signal, wherein the first input is connected to the first common node.

5. The system of claim 4, wherein the first input and the second input are a differential input signal configured to receive signal data from a transmitter.

6. The system of claim 4, wherein the first signal is a positive current signal and the second signal is a negative current signal.

7. The system of claim 4, wherein one or more common-mode currents for the first upper switching element and one or more common-mode currents for the first lower switching element are approximately equal in magnitude and opposite in sign.

8. The system of claim 4, further comprising a resistor disposed between and in electrical communication with the first common node and the first input.

9. The system of claim 4, wherein the first clock signal is about 180 degrees out of phase with the second clock signal.

10. The system of claim 4, further comprising:

a second upper switching element comprising:

a third pair of switching devices, wherein each switching device of the third pair of switching devices has a source, a gate, and a drain, wherein the source of each switching device of the third pair of switching devices is connected to a second common node, wherein the drain of one switching device of the third pair of switching devices generates a third odd output and the drain of another switching device of the third pair of switching devices generates a third even output, wherein the gate of the one switching device of the third pair of switching devices receives the first clock signal and the gate of the other switching device of the third pair of switching devices receives the second clock signal; and a second lower switching element comprising:

a fourth pair of switching devices, wherein each switching device of the fourth pair of switching devices has a source, a gate, and a drain, wherein the source of each switching device of the fourth pair of switching devices is connected to the second common node, wherein the drain of one switching device of the fourth pair of switching devices generates a fourth odd output and the drain of another switching device of the fourth pair of switching devices generates a fourth even output, wherein the gate of the one switching device of the fourth pair of switching devices receives the second clock signal and the gate of the other switching device of the fourth pair of switching devices receives the first clock signal, wherein the second input is connected to the second common node.

11. The system of claim 10, wherein one or more common-mode currents for the first upper switching element and one or more common-mode currents for the first lower switching element are approximately equal in magnitude and opposite in polarity.

12. The system of claim 10, further comprising a resistor disposed between and in electrical communication with the second common node and the second input.

13. The system of claim 10, wherein the first clock signal is about 180 degrees out of phase with the second clock signal.

14. The system of claim 4, wherein one drain outputs a positive push signal and another drain outputs a positive pull signal.

15. The system of claim 14, further comprising a first demultiplexer, the first demultiplexer configured to receive the positive push signal and the positive pull signal.

16. The system of claim 10, wherein one drain outputs a negative push signal and another drain outputs a negative pull signal.

17. The system of claim 16, further comprising a second demultiplexer, the second demultiplexer configured to receive the negative push signal and the negative pull signal.

18. A system comprising:

a sampler comprising:

a first input configured to receive a first signal and a second input configured to receive a second signal, the first signal comprising charge pulses of a first amplitude, the second signal comprising charge pulses of a second amplitude, and a first transistor network comprising a first push-pull pair of transistors of the first transistor network, the first transistor network operable to receive the first signal, the first push-pull pair of transistors controllable in response to a first clock signal and a second clock signal, wherein the first clock signal and the second clock signal have a complementary phase; and a first demultiplexer operable to receive a plurality of push-pull charge pulses from the sampler and combine the plurality of push-pull charge pulses, wherein the combined pulses have a third amplitude greater than the first amplitude or the second amplitude.

19. The system of claim 18, wherein the first transistor network further comprises:

a first upper switching element comprising:

the first push-pull pair of transistors of the first transistor network, wherein each transistor of the first push-pull pair of transistors of the first transistor network has a source, a gate, and a drain, wherein the source of each such transistor is connected to a first common node.

20. The system of claim 19, wherein the drain of one transistor of the first push-pull pair of transistors of the first transistor network generates a first odd output and the drain of another transistor of the first push-pull pair of transistors of the first transistor network generates a first even output, wherein the gate of the one transistor of the first push-pull pair of transistors of the first transistor network receives a first clock signal and the gate of the other transistor of the first push-pull pair of transistors of the first transistor network receives a second clock signal.

* * * * *